(12) United States Patent
Burns et al.

(10) Patent No.: US 7,754,016 B2
(45) Date of Patent: Jul. 13, 2010

(54) MULTIPLE AXIS TUMBLER COATING APPARATUS

(75) Inventors: Steven M. Burns, West Hartford, CT (US); Richard W. Varsell, Bristol, CT (US)

(73) Assignee: United Technologies Corporation, Hartford, CT (US)

( * ) Notice: Subject to any disclaimer, the term of this patent is extended or adjusted under 35 U.S.C. 154(b) by 1510 days.

(21) Appl. No.: 10/266,052

(22) Filed: Oct. 7, 2002

(65) Prior Publication Data
US 2004/0065262 A1  Apr. 8, 2004

(51) Int. Cl.
*H01L 21/00* (2006.01)
*C23C 16/00* (2006.01)
*C23C 14/00* (2006.01)

(52) U.S. Cl. .................. 118/728; 118/725; 118/730; 118/726

(58) Field of Classification Search .......... 118/730, 118/726
See application file for complete search history.

(56) References Cited

U.S. PATENT DOCUMENTS

| | | | |
|---|---|---|---|
| 5,558,909 A | * | 9/1996 | Poliquin et al. ............ 427/251 |
| 5,803,971 A | | 9/1998 | Menchetti et al. |
| 5,849,359 A | | 12/1998 | Burns et al. |
| 5,997,947 A | | 12/1999 | Burns et al. |
| 6,206,065 B1 | | 3/2001 | Robbie et al. |
| 6,455,173 B1 | | 9/2002 | Marijnissen et al. |

FOREIGN PATENT DOCUMENTS

| | | |
|---|---|---|
| DE | 101 16 365 C1 | 9/2002 |
| EP | 0 953 656 | 11/1999 |
| JP | 52-47530 A | 4/1977 |
| JP | 62149870 | 7/1987 |
| JP | 10-245672 | 2/1992 |
| JP | 04-013049 | 9/1998 |

* cited by examiner

*Primary Examiner*—Ram N. Kackar
(74) *Attorney, Agent, or Firm*—Bachman & LaPointe, P.C.

(57) ABSTRACT

The present invention relates to an apparatus for coating one or more workpieces such as components to be used in jet engines or industrial turbines. The apparatus comprises a device for simultaneously manipulating a workpiece about multiple axes while holding a center of the workpiece at a fixed position with respect to a source of coating material. The device for manipulating the workpiece preferably comprises a modular fixture while allows the workpiece to be simultaneously rotated about a first axis, rotated about a second axis at an angle to the first axis, and titled through a range of motion such as from +45 degrees to −45 degrees with respect to the first axis.

7 Claims, 2 Drawing Sheets

US 7,754,016 B2

MULTIPLE AXIS TUMBLER COATING APPARATUS

BACKGROUND OF THE INVENTION

The present invention relates to a process and apparatus for coating workpieces, such as components to be used in industrial turbines and jet engines.

Components, such as vanes and blades, used in industrial turbines and jet engines are typically subjected to a coating operation to improve their resistance to corrosion, thermal fatigue, and to otherwise enhance their performance. Economic concerns dictate that one must be able to simultaneously coat multiple workpieces in order to have a viable commercial process and system.

A number of different systems have been developed to coat multiple workpieces at a single time using a modular fixture arrangement. Such systems are illustrated in published European patent application 953,656 to Burns et al., U.S. Pat. No. 5,997,947 to Burns et al., U.S. Pat. No. 5,849,359 to Burns et al., and U.S. Pat. No. 5,803,971 to Menchetti et al.

Certain coating techniques, such as electron beam physical vapor deposition (EB-PVD), are line of sight techniques wherein surfaces of a workpiece which are not in line of sight with the source of coating material will not be coated. It has been found that workpieces which are not kept at a constant distance from a source of coating material will have coatings which will later exhibit undesirable characteristics. This is particularly true for those workpieces which have an airfoil portion and surfaces requiring coating perpendicular to the airfoil portion.

SUMMARY OF THE INVENTION

Accordingly, it is an object of the present invention to provide an apparatus for coating a workpiece so that the workpiece has a coating which is less susceptible to cracking or fracturing.

It is a further object of the present invention to provide a process for coating a workpiece so that workpiece has a coating which is less susceptible to undesirable characteristics.

The foregoing objects are attained by the apparatus and process of the present invention.

In accordance with the present invention, an apparatus for coating a workpiece broadly comprises a device for simultaneously manipulating a workpiece about multiple axes while holding the center of the workpiece at a fixed horizontal and vertical location.

Further, in accordance with the present invention, a process for coating a workpiece broadly comprises the steps of providing a source of coating material, providing a fixture for supporting the workpiece at a fixed distance with respect to the coating material source, rotating the workpiece about a first axis while maintaining the workpiece at the fixed distance from the coating material source, rotating the workpiece about a second axis at an angle to the first axis while rotating the workpiece about the first axis, tilting the workpiece through a range of motion up to a nominal of about +45 degrees to −45 degrees with respect to the first axis while rotating the workpiece about the first and second axes, and forming a coating material vapor.

Other details of the apparatus and process of the present invention, as well as other objects and advantages attendant thereto are set forth in the following detailed description and the accompanying drawing wherein like reference numerals depict like elements.

DETAILED DESCRIPTION OF THE PREFERRED EMBODIMENT(S)

Figure 1:
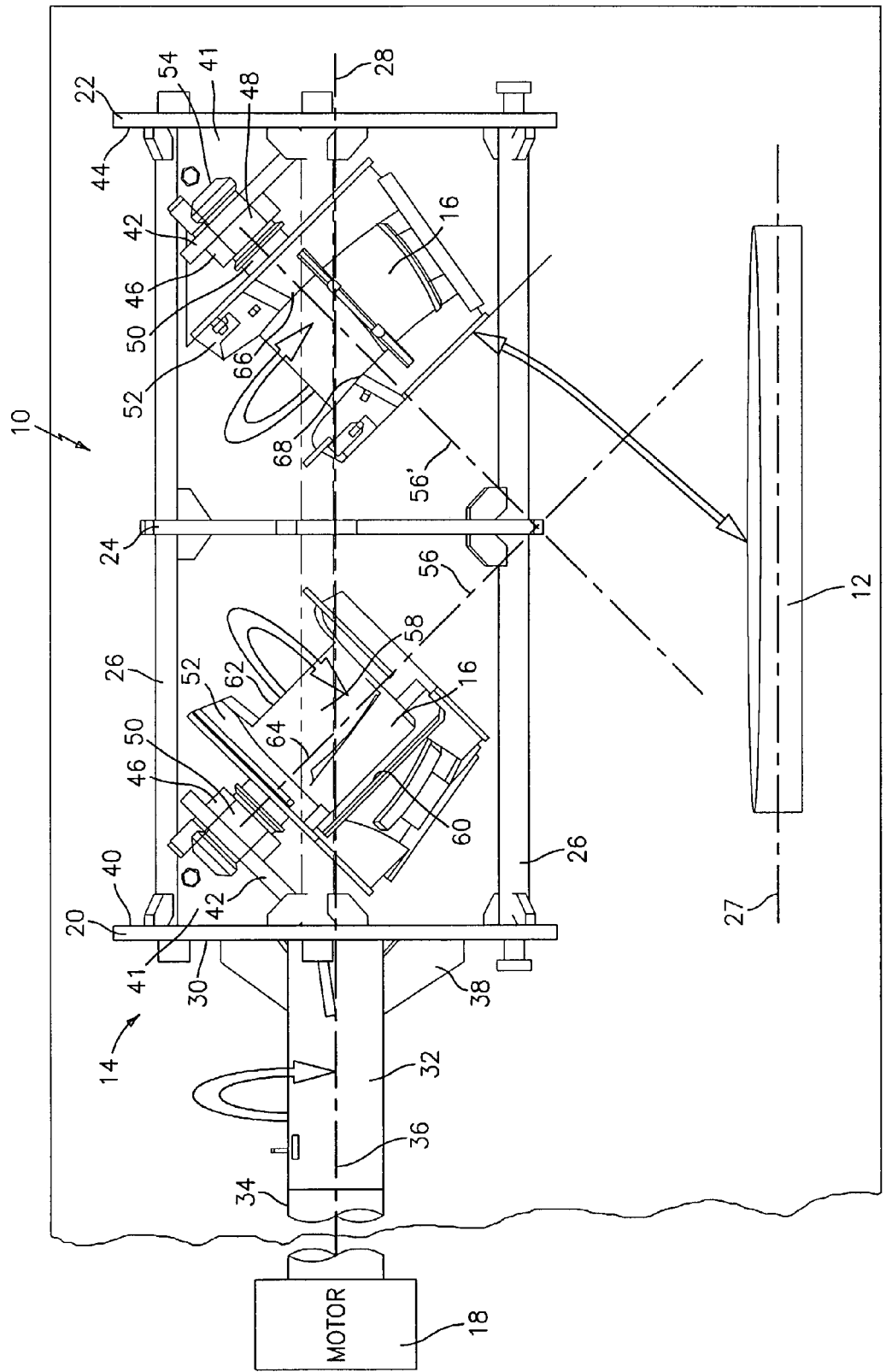
FIG. 1 illustrates an apparatus for coating one or more workpieces in accordance with the present invention.

Referring now to the drawings, an apparatus 10 for coating a workpiece, such as a vane or a blade to be used in a jet engine or an industrial turbine, is illustrated in FIG. 1. The apparatus 10 includes a source 12 of coating material and a modular fixture 14 for holding one or more workpieces 16 to be coated. The apparatus 10 further includes means (not shown) for heating the coating material to form a cloud of coating material and a motor 18 for rotating the modular fixture 14.

The modular fixture 14 allows the workpiece(s) 16 to be simultaneously moved about three axes during the coating operation while the workpiece(s) 16 are maintained in a fixed horizontal and vertical position with respect to the source 12. In particular, the fixture 14 maintains each workpiece 16, particularly its center, at a fixed distance from the coating material source 12. In a preferred arrangement of the present invention, the center of the workpiece 16 is located at the point where a first axis of rotation 36 intersects a second axis of rotation 56 or 56' to be discussed herein after. The fixture 14 of the present invention is different from other fixtures used in coating apparatuses which did not allow the workpiece(s) being coated to stay in a fixed horizontal and vertical position with respect to the source of coating material. As a result, these earlier fixtures did not optimize a coating formed on the workpiece with minimized likelihood of fracture or cracking.

The modular fixture 14 is a cage formed by a first end plate 20, a second end plate 22, a central support element 24, and a plurality of axially extending support bars 26. The axially extending support bars 26 each extend parallel to a longitudinal axis 28 of the fixture 14.

Attached to a first surface 30 of the first end plate 20 is a stub shaft 32. The stub shaft 32 is joined to the motor 18 by a mating shaft member 34 so that the motor 18 rotates the modular fixture about a first axis 36 which is coincident with the longitudinal axis 28 of the fixture 14 and which in the illustrated embodiment is parallel to the axis 27 of the source 12 of coating material. The stub shaft 32 may be joined to the first end plate 20 using any suitable means known in the art. Supports 38 may be welded to the first end plate 20 and to the stub shaft 32 to help maintain the stub shaft 32 substantially parallel to a preferred axis such as the longitudinal axis 28.

Attached to a second surface 40 of the first end plate 20 by flange 41 is an arm 42. The arm 42 extends at an angle, preferably 45 degrees, with respect to the longitudinal axis 28 of the fixture 14. A similar arm 42 is attached to an inner surface 44 of the second end plate 22.

Figure 2:
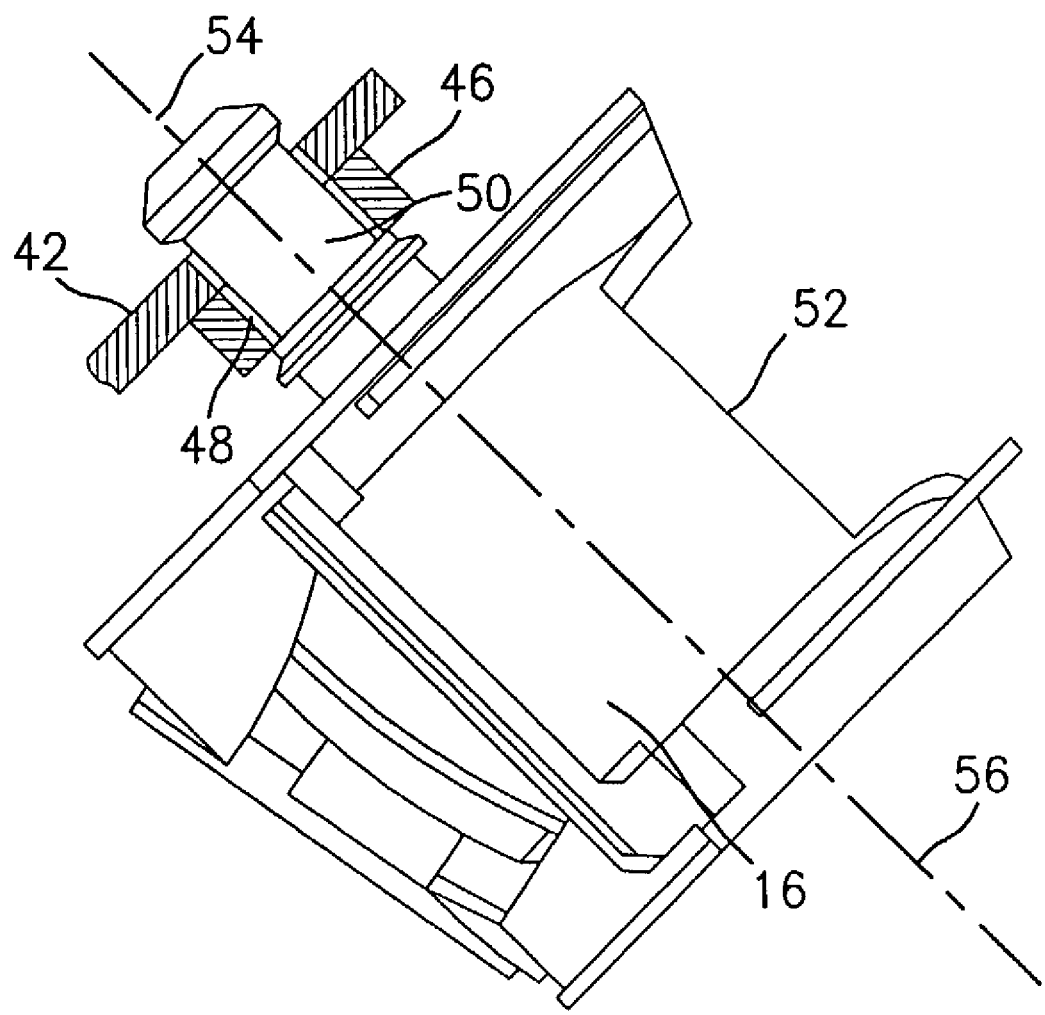
FIG. 2 is a sectional view of a spindle and bushing arrangement used in the apparatus of FIG. 1.

Referring now to both FIGS. 1 and 2, a bushing 46 is incorporated into each of the arms 42. Each bushing 46 has a central bore 48. Each workpiece 16 to be coated is secured to a spindle 50. Any suitable means known in the art may be used to secure the workpiece 16 to the spindle 50. Preferably, a holder 52 is provided at one end of the spindle 50. The holder 52 may comprise any suitable means known in the art for holding a workpiece during a coating operation. Preferably, the holder 52 is a holder such as that shown in U.S. Pat. No. 5,849,359 to Burns et al., which is incorporated by reference herein. The opposite end of the spindle 50 has a head 54 whose diameter is greater than the diameter of the bore 48.

The spindle 52 and the bushing 46 on a first one of the arms define a second axis of rotation 56 at an angle to the first axis of rotation 36, while the spindle 52 and bushing 46 on the other arm define a third axis of rotation 56' at an angle to the first axis of rotation 36. Preferably, the second and third axes are substantially perpendicular to each other. As a result of this construction, each respective workpiece 16 is capable of rotating about one of the axes 56 and 56', while it is simultaneously being rotated about the axis 36. Rotation of the workpiece 16 about the axis 56 or 56' is caused by gravity and friction. When the workpiece is a blade or a vane having an airfoil portion 58 with a leading edge 60, a trailing edge 62, and a central longitudinal axis 64, the vane or blade will tumble or rotate about the axis 56 or 56' leading edge over trailing edge on the central longitudinal axis 64.

Certain workpieces to be coated, such as blade and vanes for jet engines and industrial turbines, have surfaces 66 and 68, such as platforms or shrouds, which extend substantially perpendicular to the longitudinal axis 64 of an airfoil portion 58. In the past, it has been difficult to properly and consistently coat these substantially perpendicular surfaces. Due to the configuration of the modular fixture 14, namely, the rotation about the axis 36 and the orientation of the arms 42, the workpieces 16 will move or tilt through a nominal range of motion of preferably +45 degrees to −45 degrees with respect to the axis of rotation 36 and with respect to the coating source 12. As a result, a coating can be applied to the surfaces 66 and 68 which are less likely to spall prematurely. Depending on the angle of the arm 42, the range of tilting motion could be greater than or less than +45 degrees to −45 degrees.

The fixture 14 provides numerous advantages. First, it holds a workpiece or workpieces 16 at a fixed distance from the source 12 of coating material. Second, it holds each workpiece 16 at a fixed horizontal and vertical location with respect to the source 12 of coating material. Third, it allows each workpiece 16 to be simultaneously manipulated about multiple axes while holding the workpiece 16 at said fixed horizontal and vertical position within the coating apparatus 10. Fourth, each workpiece 16 is repeatedly titled through a range of motion of +45 degrees to −45 degrees with respect to the longitudinal axis 28 of the fixture 14. As a result of these advantages, the coating apparatus of the present invention more readily enables application of a close-to-uniform coating thickness and excellent airfoil and platform coating structure for vanes and blades. Such coatings do not erode as fast as coating produced using other systems. Further, the apparatus of the present invention provides the ability to coat multiple workpieces with each cycle. The fact that the fixture 14 is modular facilitates extremely fast part change overtimes, typically less than 60 seconds.

In operation, a source 12 of coating material is provided within the apparatus 10. The fixture 14 with one or more workpieces 16 to be coated is placed into the coating apparatus and rotated about its longitudinal axis 28. This in turn causes each workpiece 16 to rotate about the axis 36 which is coincident with the axis 28. Additionally, it causes each workpiece 16 to simultaneously rotate about a second axis at an angle to the first axis 36. Still further, it causes each workpiece 16 to tilt through a range of motion preferably from +45 degrees to −45 degrees with respect to the first axis 36 as the workpiece rotates about the first and second axes. While the fixture 14 and the workpieces are being rotated, the coating material in the source 12 is vaporized. Any suitable technique known in the art, such as electron beam physical vapor deposition, cathodic arc vaporization, or the like, may be used to created the vaporized coating material.

It is apparent that there has been provided in accordance with the present invention a multiple axis tumbler coating apparatus which fully satisfies the objects, means, and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations as fall within the broad scope of the appended claims.

What is claimed is:

1. An apparatus for coating at least one engine component having a center and an airfoil portion with a leading edge, a trailing edge, and a longitudinal axis, said apparatus comprising:
    a modular fixture having a first end plate and a stub shaft attached to a first surface of said first end plate;
    said modular fixture being rotated about a first axis defined by said stub shaft;
    means for supporting said at least one engine component at an angle with respect to said first axis, said supporting means being non-movably attached to a second surface of said end plate;
    said supporting means including means for allowing said engine component to rotate about said longitudinal axis so that said leading edge rotates about said trailing edge while said center of said at least one engine component is maintained at a fixed horizontal and vertical location with respect to a source of coating material.

2. An apparatus according to claim 1, wherein said supporting means comprises an arm attached to said second surface of said first end plate and said rotation allowing means comprising a bushing having a central bore incorporated into said arm and a spindle secured to said at least one engine component and passing through said central bore.

3. An apparatus according to claim 2, further comprising means for holding said at least one engine component attached to said spindle.

4. An apparatus according to claim 1, further comprising a second end plate secured to said first end plate by a plurality of axially extending support bars which extend parallel to said first axis.

5. An apparatus according to claim 4, further comprising a central support element attached to said support bars.

6. An apparatus according to claim 4, further comprising:
    said supporting means attached to said second surface of said first end plate supporting a first engine component; and additional means for supporting a second engine component attached to said second end plate.

7. An apparatus according to claim 6, wherein said additional supporting means comprises an arm attached to said second end plate and rotation allowing means comprising a bushing having a central bore incorporated into said arm attached to said second end plate and a spindle secured to said second engine component and passing through said central bore in said bushing incorporated into said arm attached to said second end plate.

\* \* \* \* \*